US012650465B2

(12) United States Patent　　　　　　(10) Patent No.:　US 12,650,465 B2

Mcnairy　　　　　　　　　　　　　　　(45) Date of Patent:　　　Jun. 9, 2026

(54) SELECTING AN OUTPUT AS A SYSTEM OUTPUT RESPONSIVE TO AN INDICATION OF AN ERROR

(71) Applicant: SiFive, Inc., San Mateo, CA (US)

(72) Inventor: Cameron Mcnairy, Fort Collins, CO (US)

(73) Assignee: SiFive, Inc., Santa Clara, CA (US)

( * ) Notice: Subject to any disclaimer, the term of this patent is extended or adjusted under 35 U.S.C. 154(b) by 88 days.

(21) Appl. No.: 18/500,337

(22) Filed: Nov. 2, 2023

(65) Prior Publication Data

US 2024/0142518 A1　　May 2, 2024

Related U.S. Application Data

(60) Provisional application No. 63/421,622, filed on Nov. 2, 2022.

(51) Int. Cl.
G01R 31/317　　　(2006.01)

(52) U.S. Cl.
CPC . G01R 31/31703 (2013.01); G01R 31/31726 (2013.01)

(58) Field of Classification Search
CPC ........ G01R 31/31703; G01R 31/31726; G06F 11/1641
USPC ........................................................ 714/735
See application file for complete search history.

(56) References Cited

U.S. PATENT DOCUMENTS

| | | | | |
|---|---|---|---|---|
| 5,029,071 A * | 7/1991 | Kinoshita | ............. | G06F 11/202 |
| | | | | 714/E11.061 |
| 6,357,024 B1 * | 3/2002 | Dutton | ................ | G06F 11/1641 |
| | | | | 714/E11.061 |
| 8,086,925 B2 * | 12/2011 | Gass | ........................ | G06F 11/27 |
| | | | | 714/738 |
| 8,341,477 B2 * | 12/2012 | Song | ................ | G01R 31/31922 |
| | | | | 714/724 |
| 10,915,393 B2 * | 2/2021 | Yamate | ............... | G06F 11/0727 |
| 2002/0077782 A1 * | 6/2002 | Fruehling | ........... | G06F 11/1008 |
| | | | | 714/E11.063 |
| 2003/0135790 A1 * | 7/2003 | Pignol | ................. | G06F 11/1641 |
| | | | | 714/E11.063 |
| 2020/0174829 A1 * | 6/2020 | Shao | .................... | G06F 9/30043 |
| 2023/0168978 A1 * | 6/2023 | Ulman | ................ | G06F 11/0793 |
| | | | | 714/4.1 |

* cited by examiner

*Primary Examiner* — James C Kerveros
(74) *Attorney, Agent, or Firm* — Kilpatrick Townsend & Stockton LLP

(57) ABSTRACT

A first circuitry may be configured to generate a first output based on an input and send an indication responsive to detection of an error while the first output is generated. A second circuitry may be configured to generate a second output based on the input. A wrapper circuitry may be configured to compare the first output and the second output to check correctness by default, and responsive to receipt of the indication, select the second output as a system output without checking for correctness by comparing the first output and the second output. In some implementations, the second circuitry may be configured to send a second indication responsive to detection of a second error while the second output is generated. The wrapper circuitry may be configured to, responsive to receipt of the second indication, ignore the check for correctness.

20 Claims, 9 Drawing Sheets

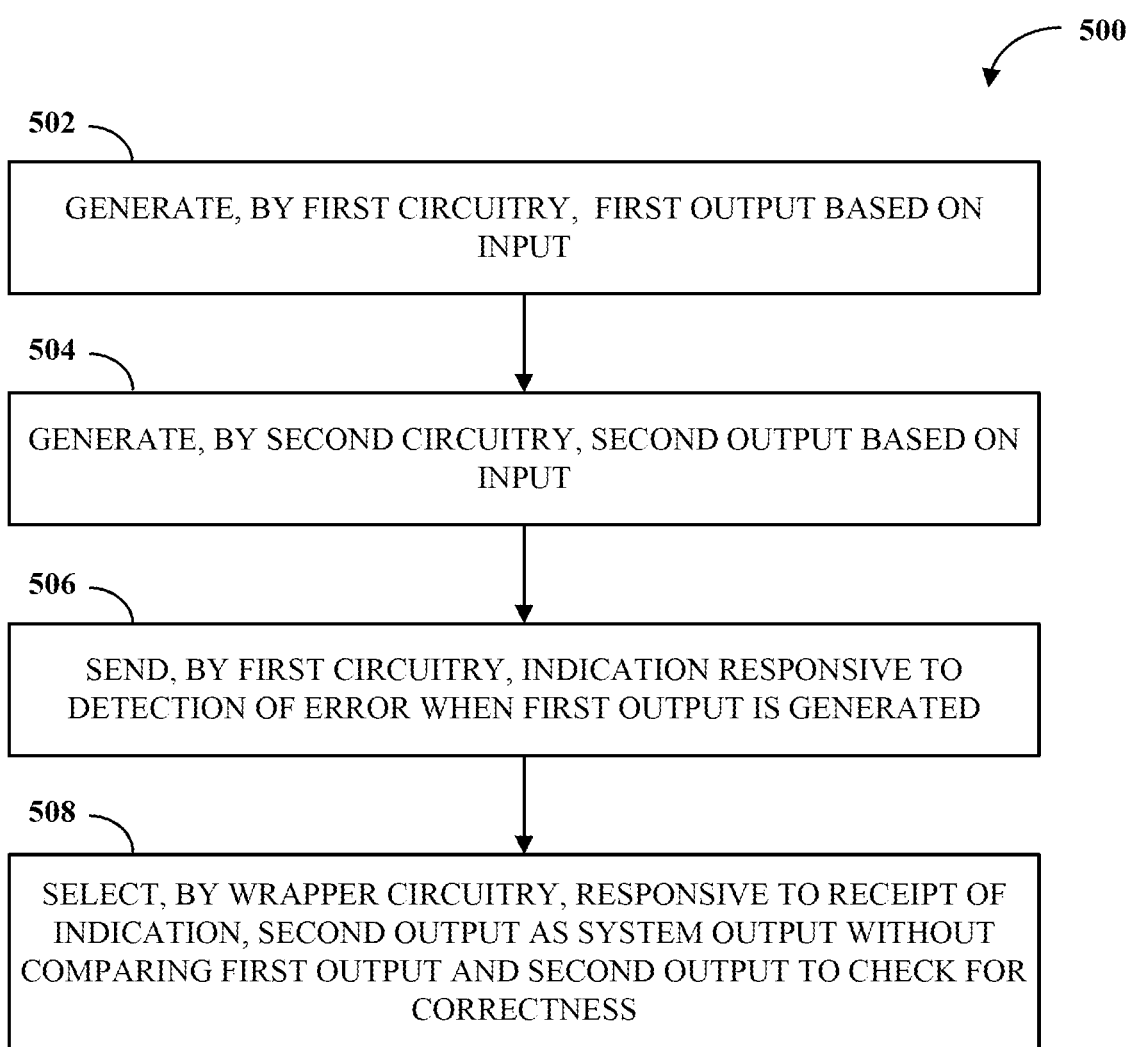

502

GENERATE, BY FIRST CIRCUITRY, FIRST OUTPUT BASED ON INPUT

504

GENERATE, BY SECOND CIRCUITRY, SECOND OUTPUT BASED ON INPUT

506

SEND, BY FIRST CIRCUITRY, INDICATION RESPONSIVE TO DETECTION OF ERROR WHEN FIRST OUTPUT IS GENERATED

508

SELECT, BY WRAPPER CIRCUITRY, RESPONSIVE TO RECEIPT OF INDICATION, SECOND OUTPUT AS SYSTEM OUTPUT WITHOUT COMPARING FIRST OUTPUT AND SECOND OUTPUT TO CHECK FOR CORRECTNESS

602
GENERATE, BY FIRST CIRCUITRY,  FIRST OUTPUT BASED ON INPUT

604
GENERATE, BY SECOND CIRCUITRY, SECOND OUTPUT BASED ON INPUT

606
SEND, BY SECOND CIRCUITRY, INDICATION RESPONSIVE TO DETECTION OF ERROR WHEN SECOND OUTPUT IS GENERATED

608
IGNORE, BY WRAPPER CIRCUITRY, RESPONSIVE TO RECEIPT OF INDICATION, COMPARING FIRST OUTPUT AND SECOND OUTPUT TO CHECK FOR CORRECTNESS

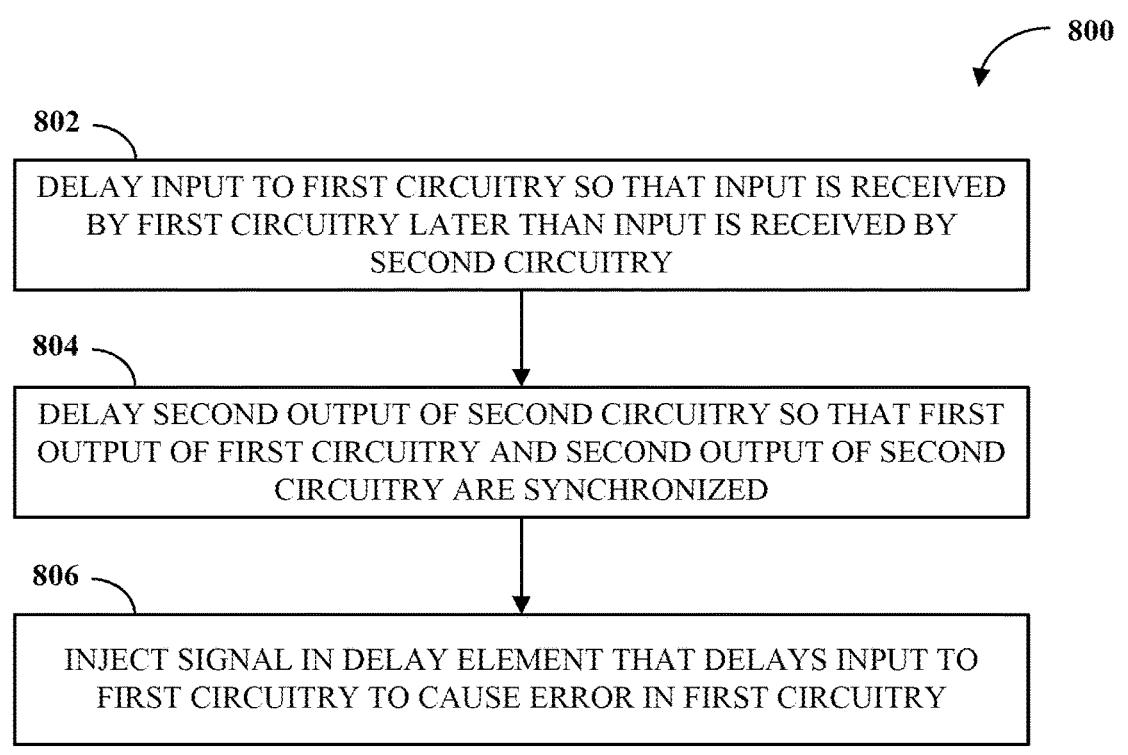

800

802

DELAY INPUT TO FIRST CIRCUITRY SO THAT INPUT IS RECEIVED BY FIRST CIRCUITRY LATER THAN INPUT IS RECEIVED BY SECOND CIRCUITRY

804

DELAY SECOND OUTPUT OF SECOND CIRCUITRY SO THAT FIRST OUTPUT OF FIRST CIRCUITRY AND SECOND OUTPUT OF SECOND CIRCUITRY ARE SYNCHRONIZED

806

INJECT SIGNAL IN DELAY ELEMENT THAT DELAYS INPUT TO FIRST CIRCUITRY TO CAUSE ERROR IN FIRST CIRCUITRY

DELAY INPUT TO FIRST CIRCUITRY SO THAT INPUT IS RECEIVED BY FIRST CIRCUITRY LATER THAN INPUT IS RECEIVED BY SECOND CIRCUITRY

904

DELAY SECOND OUTPUT OF SECOND CIRCUITRY SO THAT FIRST OUTPUT OF FIRST CIRCUITRY AND SECOND OUTPUT OF SECOND CIRCUITRY ARE SYNCHRONIZED

906

INJECT SIGNAL IN DELAY ELEMENT THAT DELAYS SECOND OUTPUT OF SECOND

900

SELECTING AN OUTPUT AS A SYSTEM OUTPUT RESPONSIVE TO AN INDICATION OF AN ERROR

CROSS-REFERENCE TO RELATED APPLICATION(S)

This application claims priority to and the benefit of U.S. Provisional Patent Application Ser. No. 63/421,622, filed Nov. 2, 2022, the entire disclosure of which is hereby incorporated by reference.

TECHNICAL FIELD

This disclosure relates generally to integrated circuits and, more specifically, to selecting an output as a system output responsive to an indication of an error.

BACKGROUND

In some computing environments, reliability in a system must be maintained at a high level as compared to typical computing environments, such as personal computers. For example, in some applications, such as applications involving Automotive Safety Integrity Level D (ASIL D), referring to a classification of hazard defined within ISO 26262 ("Road vehicles—Functional safety"), performance may be sacrificed to maintain reliability at a required level.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 5 is a flow chart of an example of a technique for selecting an output as a system output responsive to an indication of an error.

FIG. 8 is a flow chart of an example of a technique for injecting a signal in a delay element to cause an error.

DETAILED DESCRIPTION

Figure 1:
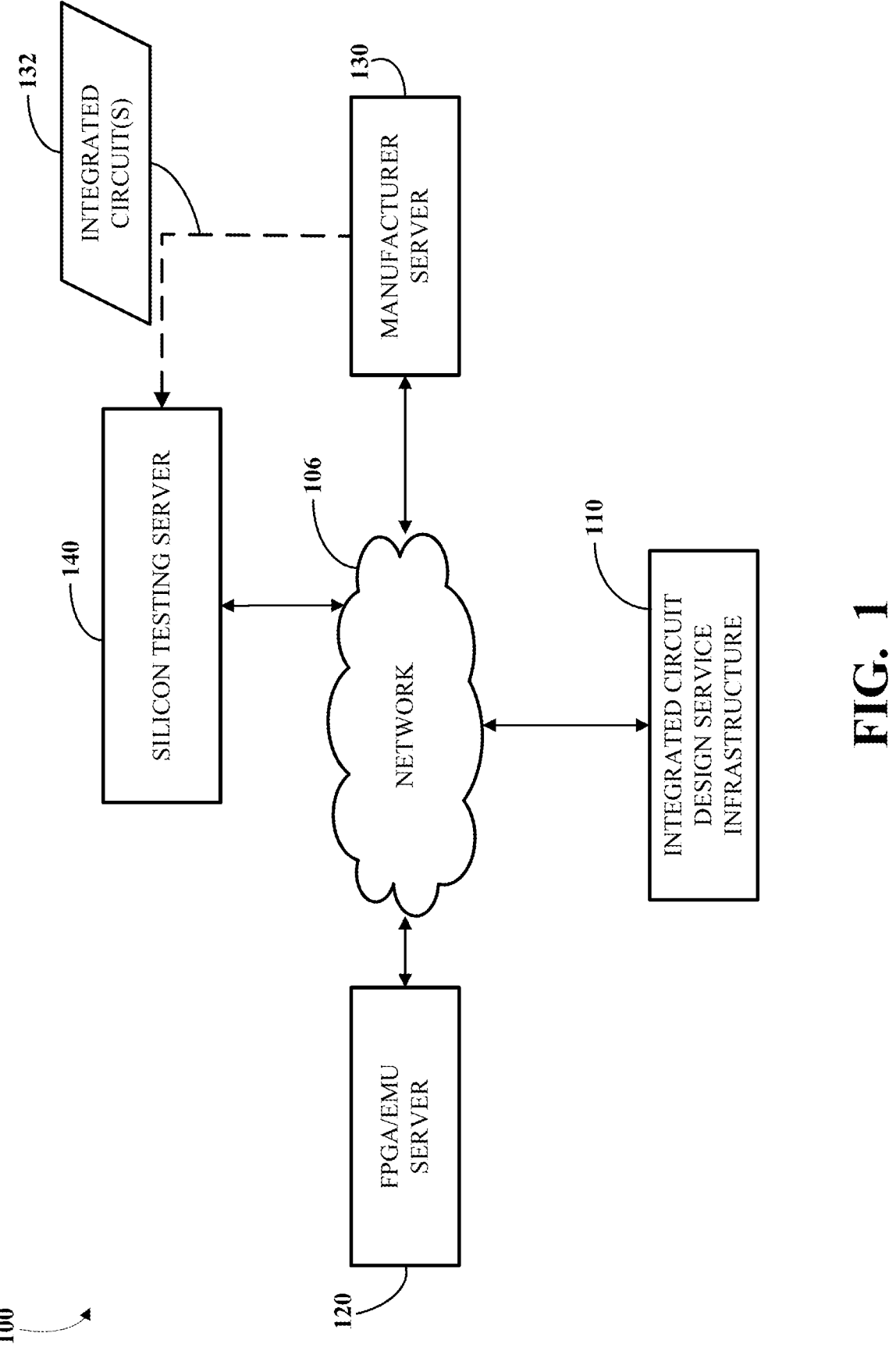
FIG. 1 is a block diagram of an example of a system for facilitating generation and manufacture of integrated circuits.

Reliability in a computing environment may be multifaceted. For example, reliability can include correctness of output and availability of resources. One technique for maintaining correctness is to operate multiple resources (e.g., processor cores) in lockstep. For example, a first circuitry, such as a first processor core, may be designated as a master that provides an output to a system, while a second circuitry, such as a second processor core, may be designated as a checker that checks for correctness of the output that is provided. If outputs of the first and second circuitry do not match, the system can avoid relying on the output from the circuitry based on the difference. However, in such cases, the system may lose availability of the circuitry until a synchronization event can occur. For example, the synchronization event may include restarting the first and second circuitry from an initial state so that the first and second circuitry may re-enter lockstep operation.

Implementations of this disclosure are designed to improve the availability of circuitry (e.g., functional units, such as integer units, vector units, arithmetic logic units, or encryption units, or processor cores, or integrated circuits, such as a system-on-a-chip (SoC)) by leveraging existing error detection capabilities implemented by the microarchitecture of the circuitry to change how the correctness of the output of the circuitry is maintained. In a computing environment, a first circuitry (e.g., a master) can generate a first output based on an input. The first circuitry can send a first indication (e.g., a first hint, which may indicate a future divergence between outputs) responsive to detection of a first error when the first output is generated. For example, the first error can be detected using at least one of an error correction code (ECC), a parity bit, a checksum, or a cyclic redundancy check (CRC) determined by error detection circuitry implemented by the first circuitry. A second circuitry (e.g., a checker) can generate a second output based on the input. The second circuitry can send a second indication (e.g., a second hint, which may indicate a future divergence between outputs) responsive to detection of a second error while the second output is generated. For example, the second error can be detected using at least one of an ECC, a parity bit, a checksum, or a CRC determined by error detection circuitry implemented by the second circuitry.

A wrapper circuitry can select the first output as a system output, and compare the first output and the second output to check for correctness. The check can be performed by comparing the first output to the second output to detect a difference between the first output and the second output. The wrapper circuitry can compare the first output and the second output to check correctness by default, and responsive to receipt of the first indication (e.g., the first hint), select the second output as the system output without checking for correctness by comparing the first output and the second output (e.g., a dynamic master/checker changeover). For example, the wrapper circuitry can select the second output and ignore the check until a synchronization event between the first circuitry and the second circuitry can occur (e.g., synchronizing the first circuitry to the second circuitry). The wrapper circuitry can, responsive to receipt of the second indication (e.g., the second hint), ignore the check for correctness. For example, the wrapper circuitry can maintain the first output and ignore the check until the synchronization event between the first circuitry and the second circuitry can occur (e.g., synchronizing the second circuitry to the first circuitry). As a result, availability of the circuitry in the system may be improved. For example, a deadlock, resulting from transaction suppression due to a difference between the first output and the second output, may be avoided, such as by continuing to use the circuitry without the error (e.g., the first circuitry or the second circuitry) for a limited time until the synchronization event re-establishes lockstep checking and operation.

To describe some implementations in greater detail, reference is first made to examples of hardware and software structures used to implement a system including components that may select an output as a system output responsive to an indication of an error. FIG. 1 is a block diagram of an example of a system 100 for generation and manufacture of integrated circuits. The system 100 includes a network 106, an integrated circuit design service infrastructure 110 (e.g., integrated circuit generator), a field programmable gate array (FPGA)/emulator server 120, and a manufacturer server 130. For example, a user may utilize a web client or a scripting application program interface (API) client to command the integrated circuit design service infrastructure 110 to automatically generate an integrated circuit design based on a set of design parameter values selected by the user for one or more template integrated circuit designs. In some implementations, the integrated circuit design service infrastructure 110 may be configured to generate an integrated circuit design like the integrated circuit design shown and described in FIGS. 3 and 4.

The integrated circuit design service infrastructure 110 may include a register-transfer level (RTL) service module configured to generate an RTL data structure for the integrated circuit based on a design parameters data structure. For example, the RTL service module may be implemented as Scala code. For example, the RTL service module may be implemented using Chisel. For example, the RTL service module may be implemented using flexible intermediate representation for register-transfer level (FIRRTL) and/or a FIRRTL compiler. For example, the RTL service module may be implemented using Diplomacy. For example, the RTL service module may enable a well-designed chip to be automatically developed from a high level set of configuration settings using a mix of Diplomacy, Chisel, and FIRRTL. The RTL service module may take the design parameters data structure (e.g., a java script object notation (JSON) file) as input and output an RTL data structure (e.g., a Verilog file) for the chip.

In some implementations, the integrated circuit design service infrastructure 110 may invoke (e.g., via network communications over the network 106) testing of the resulting design that is performed by the FPGA/emulation server 120 that is running one or more FPGAs or other types of hardware or software emulators. For example, the integrated circuit design service infrastructure 110 may invoke a test using a field programmable gate array, programmed based on a field programmable gate array emulation data structure, to obtain an emulation result. The field programmable gate array may be operating on the FPGA/emulation server 120, which may be a cloud server. Test results may be returned by the FPGA/emulation server 120 to the integrated circuit design service infrastructure 110 and relayed in a useful format to the user (e.g., via a web client or a scripting API client).

The integrated circuit design service infrastructure 110 may also facilitate the manufacture of integrated circuits using the integrated circuit design in a manufacturing facility associated with the manufacturer server 130. In some implementations, a physical design specification (e.g., a graphic data system (GDS) file, such as a GDSII file) based on a physical design data structure for the integrated circuit is transmitted to the manufacturer server 130 to invoke manufacturing of the integrated circuit (e.g., using manufacturing equipment of the associated manufacturer). For example, the manufacturer server 130 may host a foundry tape-out website that is configured to receive physical design specifications (e.g., such as a GDSII file or an open artwork system interchange standard (OASIS) file) to schedule or otherwise facilitate fabrication of integrated circuits. In some implementations, the integrated circuit design service infrastructure 110 supports multi-tenancy to allow multiple integrated circuit designs (e.g., from one or more users) to share fixed costs of manufacturing (e.g., reticle/mask generation, and/or shuttles wafer tests). For example, the integrated circuit design service infrastructure 110 may use a fixed package (e.g., a quasi-standardized packaging) that is defined to reduce fixed costs and facilitate sharing of reticle/ mask, wafer test, and other fixed manufacturing costs. For example, the physical design specification may include one or more physical designs from one or more respective physical design data structures in order to facilitate multi-tenancy manufacturing.

In response to the transmission of the physical design specification, the manufacturer associated with the manufacturer server 130 may fabricate and/or test integrated circuits based on the integrated circuit design. For example, the associated manufacturer (e.g., a foundry) may perform optical proximity correction (OPC) and similar post-tape-out/pre-production processing, fabricate the integrated circuit(s) 132, update the integrated circuit design service infrastructure 110 (e.g., via communications with a controller or a web application server) periodically or asynchronously on the status of the manufacturing process, perform appropriate testing (e.g., wafer testing), and send to a packaging house for packaging. A packaging house may receive the finished wafers or dice from the manufacturer and test materials and update the integrated circuit design service infrastructure 110 on the status of the packaging and delivery process periodically or asynchronously. In some implementations, status updates may be relayed to the user when the user checks in using the web interface, and/or the controller might email the user that updates are available.

In some implementations, the resulting integrated circuit(s) 132 (e.g., physical chips) are delivered (e.g., via mail) to a silicon testing service provider associated with a silicon testing server 140. In some implementations, the resulting integrated circuit(s) 132 (e.g., physical chips) are installed in a system controlled by the silicon testing server 140 (e.g., a cloud server), making them quickly accessible to be run and tested remotely using network communications to control the operation of the integrated circuit(s) 132. For example, a login to the silicon testing server 140 controlling a manufactured integrated circuit(s) 132 may be sent to the integrated circuit design service infrastructure 110 and relayed to a user (e.g., via a web client). For example, the integrated circuit design service infrastructure 110 may be used to control testing of one or more integrated circuit(s) 132.

Figure 2:
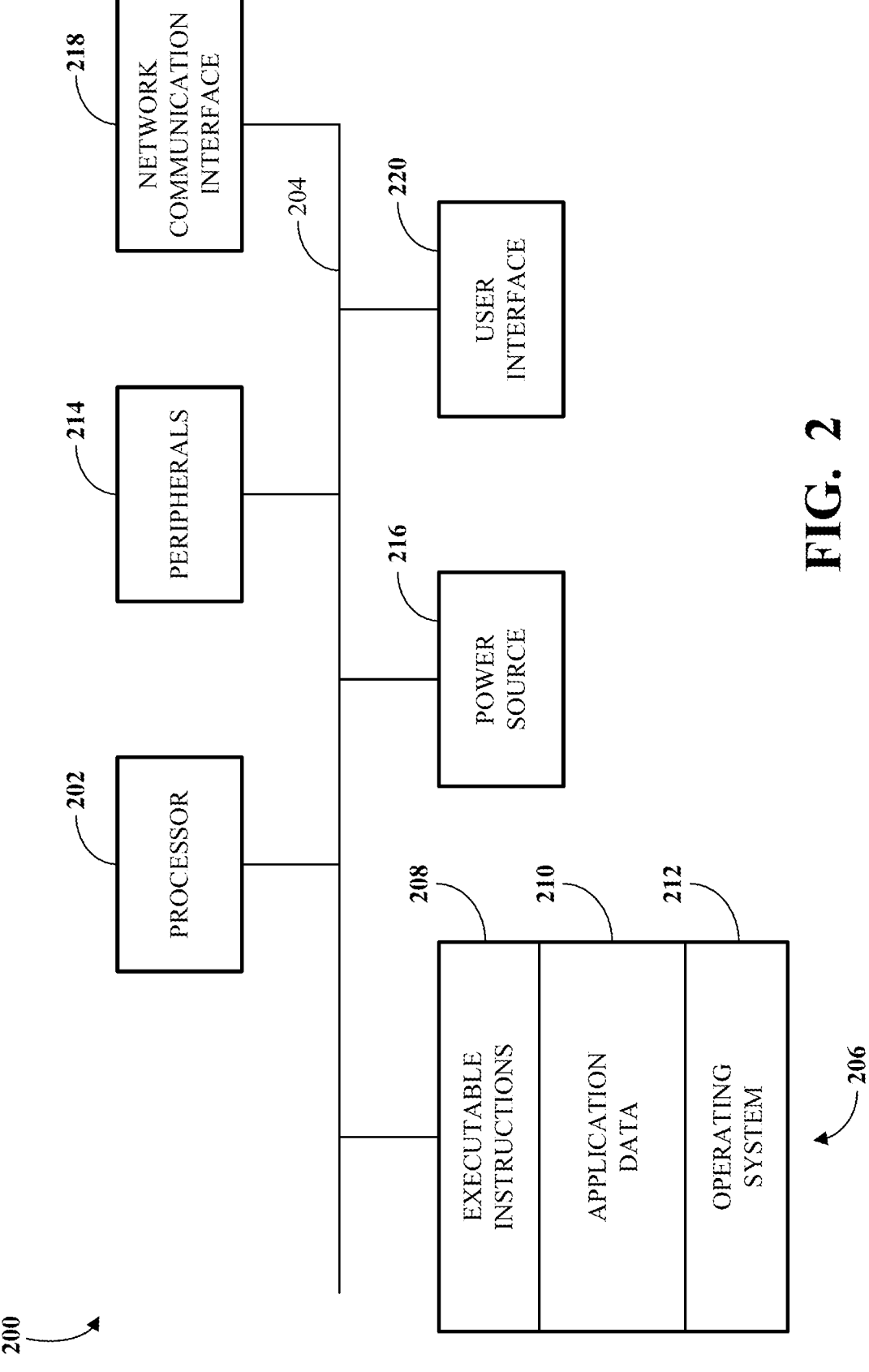
FIG. 2 is a block diagram of an example of a system for facilitating generation of a circuit representation.

FIG. 2 is a block diagram of an example of a system 200 for facilitating generation of integrated circuits, for facilitating generation of a circuit representation for an integrated circuit, and/or for programming or manufacturing an integrated circuit. The system 200 is an example of an internal configuration of a computing device. The system 200 may be used to implement the integrated circuit design service infrastructure 110, and/or to generate a file that generates a circuit representation of an integrated circuit design like the integrated circuit design shown and described in FIGS. 3 and 4.

The processor 202 can be a central processing unit (CPU), such as a microprocessor, and can include single or multiple processors having single or multiple processing cores. Alternatively, the processor 202 can include another type of device, or multiple devices, now existing or hereafter developed, capable of manipulating or processing information. For example, the processor 202 can include multiple processors interconnected in any manner, including hardwired or networked, including wirelessly networked. In some implementations, the operations of the processor 202 can be distributed across multiple physical devices or units that can be coupled directly or across a local area or other suitable type of network. In some implementations, the processor 202 can include a cache, or cache memory, for local storage of operating data or instructions.

The memory 206 can include volatile memory, non-volatile memory, or a combination thereof. For example, the memory 206 can include volatile memory, such as one or more dynamic random access memory (DRAM) modules such as double data rate (DDR) synchronous DRAM (SDRAM), and non-volatile memory, such as a disk drive, a solid-state drive, flash memory, Phase-Change Memory (PCM), or any form of non-volatile memory capable of persistent electronic information storage, such as in the absence of an active power supply. The memory 206 can include another type of device, or multiple devices, now existing or hereafter developed, capable of storing data or instructions for processing by the processor 202. The processor 202 can access or manipulate data in the memory 206 via the bus 204. Although shown as a single block in FIG. 2, the memory 206 can be implemented as multiple units. For example, a system 200 can include volatile memory, such as random access memory (RAM), and persistent memory, such as a hard drive or other storage.

The memory 206 can include executable instructions 208, data, such as application data 210, an operating system 212, or a combination thereof, for immediate access by the processor 202. The executable instructions 208 can include, for example, one or more application programs, which can be loaded or copied, in whole or in part, from non-volatile memory to volatile memory to be executed by the processor 202. The executable instructions 208 can be organized into programmable modules or algorithms, functional programs, codes, code segments, or combinations thereof to perform various functions described herein. For example, the executable instructions 208 can include instructions executable by the processor 202 to cause the system 200 to automatically, in response to a command, generate an integrated circuit design and associated test results based on a design parameters data structure. The application data 210 can include, for example, user files, database catalogs or dictionaries, configuration information or functional programs, such as a web browser, a web server, a database server, or a combination thereof. The operating system 212 can be, for example, Microsoft Windows®, MacOS® or Linux®; an operating system for a small device, such as a smartphone or tablet device; or an operating system for a large device, such as a mainframe computer. The memory 206 can comprise one or more devices and can utilize one or more types of storage, such as solid-state or magnetic storage.

The peripherals 214 can be coupled to the processor 202 via the bus 204. The peripherals 214 can be sensors or detectors, or devices containing any number of sensors or detectors, which can monitor the system 200 itself or the environment around the system 200. For example, a system 200 can contain a temperature sensor for measuring temperatures of components of the system 200, such as the processor 202. Other sensors or detectors can be used with the system 200, as can be contemplated. In some implementations, the power source 216 can be a battery, and the system 200 can operate independently of an external power distribution system. Any of the components of the system 200, such as the peripherals 214 or the power source 216, can communicate with the processor 202 via the bus 204.

The network communication interface 218 can also be coupled to the processor 202 via the bus 204. In some implementations, the network communication interface 218 can comprise one or more transceivers. The network communication interface 218 can, for example, provide a connection or link to a network, such as the network 106 shown in FIG. 1, via a network interface, which can be a wired network interface, such as Ethernet, or a wireless network interface. For example, the system 200 can communicate with other devices via the network communication interface 218 and the network interface using one or more network protocols, such as Ethernet, transmission control protocol (TCP), Internet protocol (IP), power line communication (PLC), Wi-Fi, infrared, general packet radio service (GPRS), global system for mobile communications (GSM), code division multiple access (CDMA), or other suitable protocols.

A user interface 220 can include a display; a positional input device, such as a mouse, touchpad, touchscreen, or the like; a keyboard; or other suitable human or machine interface devices. The user interface 220 can be coupled to the processor 202 via the bus 204. Other interface devices that permit a user to program or otherwise use the system 200 can be provided in addition to or as an alternative to a display. In some implementations, the user interface 220 can include a display, which can be a liquid crystal display (LCD), a cathode-ray tube (CRT), a light emitting diode (LED) display (e.g., an organic light emitting diode (OLED) display), or other suitable display. In some implementations, a client or server can omit the peripherals 214. The operations of the processor 202 can be distributed across multiple clients or servers, which can be coupled directly or across a local area or other suitable type of network. The memory 206 can be distributed across multiple clients or servers, such as network-based memory or memory in multiple clients or servers performing the operations of clients or servers. Although depicted here as a single bus, the bus 204 can be composed of multiple buses, which can be connected to one another through various bridges, controllers, or adapters.

A non-transitory computer readable medium may store a circuit representation that, when processed by a computer, is used to program or manufacture an integrated circuit. For example, the circuit representation may describe the integrated circuit specified using a computer readable syntax. The computer readable syntax may specify the structure or function of the integrated circuit or a combination thereof. In some implementations, the circuit representation may take the form of a hardware description language (HDL) program, a register-transfer level (RTL) data structure, a flexible intermediate representation for register-transfer level (FIRRTL) data structure, a Graphic Design System II (GDSII) data structure, a netlist, or a combination thereof. In some implementations, the integrated circuit may take the form of a field programmable gate array (FPGA), application specific integrated circuit (ASIC), system-on-a-chip (SoC), or some combination thereof. A computer may process the circuit representation in order to program or manufacture an integrated circuit, which may include programming a field programmable gate array (FPGA) or manufacturing an application specific integrated circuit (ASIC) or a system on a chip (SoC). In some implementations, the circuit representation may comprise a file that, when processed by a computer, may generate a new description of the integrated circuit. For example, the circuit representation could be written in a language such as Chisel, an HDL embedded in Scala, a statically typed general purpose programming language that supports both object-oriented programming and functional programming.

In an example, a circuit representation may be a Chisel language program which may be executed by the computer to produce a circuit representation expressed in a FIRRTL data structure. In some implementations, a design flow of processing steps may be utilized to process the circuit representation into one or more intermediate circuit representations followed by a final circuit representation which is then used to program or manufacture an integrated circuit. In one example, a circuit representation in the form of a Chisel program may be stored on a non-transitory computer read-able medium and may be processed by a computer to produce a FIRRTL circuit representation. The FIRRTL cir-cuit representation may be processed by a computer to produce an RTL circuit representation. The RTL circuit representation may be processed by the computer to produce a netlist circuit representation. The netlist circuit represen-tation may be processed by the computer to produce a GDSII circuit representation. The GDSII circuit representation may be processed by the computer to produce the integrated circuit.

In another example, a circuit representation in the form of Verilog or VHDL may be stored on a non-transitory com-puter readable medium and may be processed by a computer to produce an RTL circuit representation. The RTL circuit representation may be processed by the computer to produce a netlist circuit representation. The netlist circuit represen-tation may be processed by the computer to produce a GDSII circuit representation. The GDSII circuit representation may be processed by the computer to produce the integrated circuit. The foregoing steps may be executed by the same computer, different computers, or some combination thereof, depending on the implementation.

Figure 3:
FIG. 3 is a block diagram of an example of a system that selects an output as a system output responsive to an indication of an error.
Figure 4:
FIG. 4 is a block diagram of an example of a system that includes delay elements to introduce temporal diversity in a lockstep system.

FIG. 3 is a block diagram of an example of a system 300 that selects an output as a system output responsive to an indication of an error. The system 300 may include a first circuitry 302, a second circuitry 304, and a wrapper circuitry 306 implemented in a computing environment. For example, the first circuitry 302 could be a first processor core and the second circuitry 304 could be a second processor core. The first and second processor cores could include private caches and other logic (e.g., the first and second processor cores could be first and second tiles). In another example, the first circuitry 302 could be a first functional unit implemented by a first processor core and the second circuitry 304 could be a second functional unit implemented by the first processor core or a second processor core. For example, the first and second functional units could be integer units, vector units, arithmetic logic units (ALU's), or encryption units imple-mented by a processor core. In another example, the first circuitry 302 could be a first SoC and the second circuitry 304 could be a second SoC.

The first circuitry 302 and the second circuitry 304 may receive an input 308 via the wrapper circuitry 306. For example, the input 308 could be a system input, transmitted to the wrapper circuitry 306, from a second system 310 in the computing environment (e.g., logic outside of the wrap-per circuitry 306, such as a computing system involving ASIL D). The first circuitry 302 can generate a first output 312 based on the input 308, and the second circuitry 304 can generate a second output 314 based on the input 308. The first output 312 and the second output 314 can each include one or more signals that are generated in response to the input 308. For example, the first circuitry 302 and the second circuitry 304 can operate synchronously with one another, in lockstep, to generate the first output 312 and the second output 314. For example, the first circuitry 302 and the second circuitry 304 can implement a functional redundancy check, which could include a first processor core and a second processor core executing the same routines in par-allel, or a first functional unit and a second functional unit performing the same operations in parallel. The first output 312 and the second output 314 can be transmitted back to the wrapper circuitry 306. The wrapper circuitry 306 can imple-ment a selection circuitry 316 to select the first output 312 or the second output 314 as a system output 318. The wrapper circuitry 306 can initially select the first output 312 to be the system output 318, so that the first circuitry 302 is operating as a master. The wrapper circuitry 306 can trans-mit the system output 318 to the second system 310 in the computing environment (e.g., the logic outside of the wrap-per circuitry 306).

The wrapper circuitry 306 may include a state machine and configuration registers. The wrapper circuitry 306 can compare the first output 312 and the second output 314 to check for correctness. The wrapper circuitry 306 can ini-tially use the second output 314 to check for correctness of the first output 312, so that the second circuitry 304 is operating as a checker when the first circuitry 302 is operating as a master (e.g., in lockstep). The check can be performed by comparing the first output 312 to the second output 314 to detect a difference between the first output 312 and the second output 314. For example, the wrapper circuitry 306 can implement a checker circuitry 320 to compare the first output 312 to the second output 314 to determine the difference (e.g., to check for correctness). The checker circuitry 320 can generate a difference detection 322 when a difference the first output 312 and the second output 314 is detected. For example, the wrapper circuitry 306 can transmit the difference detection 322 to the second system 310 in the computing environment when a difference is detected (e.g., the logic outside of the wrapper circuitry 306). This may enable the second system 310 to avoid relying on the system output 318 when the first output 312 and the second output 314 do not match (e.g., the second system 310 may ignore the system output 318, thereby isolating the first circuitry 302 and the second circuitry 304, resulting in a loss of work from the first circuitry 302 and the second circuitry 304). However, to improve the availability of the first circuitry 302 and the second circuitry 304, existing error detection capabilities implemented by the microarchitectures of the first circuitry 302 and the second circuitry 304 can be leveraged to change how the correctness of the system output 318 of the circuitry is maintained.

For example, an error detection circuitry 332 imple-mented by the microarchitecture of the first circuitry 302 (e.g., the master), which in other systems may be considered superseded based on operating in lockstep, can be used to detect an error in the first circuitry 302 (e.g., a first error). The first error could be an anomalous condition that may or may not be a real error condition. The first error may be detected, for example, using ECC, a parity bit, a checksum, or a CRC, implemented by the first circuitry 302. For example, when the first circuitry 302 is a first processor core, the first error could be an error in a private cache (e.g., a level one (L1) cache) implemented by the first processor core, which could be detected using ECC or a parity bit associated with the cache. In another example, when the first circuitry 302 is a first processor core with multiple pipeline stages (e.g., fetch, decode, execute, and write back), the first error may be detected in an earlier pipeline stage (e.g., the fetch, the decode, or the execute) before a later pipeline stage (e.g., the write back) that writes data to generate the first output 312. In another example, when the first circuitry 302 is a first ALU, protection bits can be added to operands used by the first ALU, which could be used to detect the first error. In another example, the error detection circuitry 332 could detect the first error as a system anomaly, such as a voltage loss, a clock loss, or other anomaly that may cause a difference between the first output 312 and the second output 314. The first circuitry 302 can send a first indication 334 (e.g., a first divergence hint) responsive to detection of the first error, including while the first output 312 is generated. For example, the first indication 334 could include one or more signals that are generated by the first circuitry 302, which may not be included in the first output 312. The first circuitry 302 can send the first indication 334 to the wrapper circuitry 306 before the first error causes the first output 312 and the second output 314 to be different (e.g., as detected by the checker circuitry 320). In some implementations, types of errors may be classified by the error detection circuitry 332 so that a first type of error can cause the error detection circuitry 332 to send the first indication 334 (e.g., uncorrectable errors) while a second type of error would not cause the error detection circuitry 332 to send the first indication 334 (e.g., correctable errors).

Similarly, error detection circuitry 342 implemented by the microarchitecture of the second circuitry 304 (e.g., the checker), which in other systems may be considered superseded based on operating in lockstep, can be used to detect an error in the second circuitry 304 (e.g., a second error). The second error could be an anomalous condition that may or may not be a real error condition. The second error may be detected, for example, using ECC, a parity bit, a checksum, or a CRC, implemented by the second circuitry 304. For example, when the second circuitry 304 is a second processor core, the second error could be an error in a private cache (e.g., an L1 cache) implemented by the second processor core, which could be detected using ECC or a parity bit associated with the cache. In another example, when the second circuitry 304 is a second processor core with multiple pipeline stages (e.g., fetch, decode, execute, and write back), the second error may be detected in an earlier pipeline stage (e.g., the fetch, the decode, or the execute) before a later pipeline stage (e.g., the write back) that writes data to generate the second output 314. In another example, when the second circuitry 304 is a second ALU, protection bits can be added to operands used by the second ALU, which could be used to detect the second error. In another example, the error detection circuitry 342 could detect the second error as a system anomaly, such as a voltage loss, a clock loss, or other anomaly that may cause a difference between the first output 312 and the second output 314. The second circuitry 304 can send a second indication 344 (e.g., a second divergence hint) responsive to detection of the second error, including while the second output 314 is generated. For example, the second indication 344 could include one or more signals that are generated by the second circuitry 304, which may not be included in the second output 314. The second circuitry 304 can send the second indication 344 to the wrapper circuitry 306 before the second error causes the first output 312 and the second output 314 to be different (e.g., as detected by the checker circuitry 320). In some implementations, types of errors may be classified by the error detection circuitry 342 so that a first type of error can cause the error detection circuitry 342 to send the second indication 344 (e.g., uncorrected errors) while a second type of error would not cause the error detection circuitry 342 to send the second indication 344 (e.g., corrected errors).

In some cases, the error detection circuitry 332, implemented by the first circuitry 302 (e.g., the master), can detect an error. The first circuitry 302 can send the first indication 334 to the wrapper circuitry 306 based on the detection. The wrapper circuitry 306 can compare the first output 312 and the second output 314 to check correctness by default, and responsive to receipt of the first indication 334, select the second output 314 as the system output 318 (e.g., a recovery response that includes a dynamic master/checker changeover). For example, the wrapper circuitry 306 can implement a monitor circuitry 350 to receive the first indication 334. The monitor circuitry 350 can control the selection made by the selection circuitry 316 (e.g., the first output 312 or the second output 314). The monitor circuitry 350 can control the selection circuitry 316 to select the second output 314 based on receiving the first indication 334. Further, the wrapper circuitry 306 can ignore comparing the first output 312 and the second output 314 to check for correctness based on receiving the first indication 334 (e.g., stop checking). For example, the wrapper circuitry 306 can disable the checker circuitry 320, or otherwise block the difference detection 322, based on receiving the first indication 334. As a result, the wrapper circuitry 306 can select the second output 314 and ignore the check to maintain availability.

In some implementations, the wrapper circuitry 306 can select the second output 314 and ignore the check until a synchronization event occurs between the first circuitry 302 and the second circuitry 304. The synchronization event may synchronize the first circuitry 302 to the second circuitry 304, such as for restarting lockstep operation between the first circuitry 302 and the second circuitry 304. The synchronization event may occur after selecting the second output 314 and ignoring the check for correctness. The synchronization event may synchronize the first circuitry 302 to the second circuitry 304 based on state information associated with the second circuitry 304. The state information may include the states of one or more functional blocks implemented by the first circuitry 302, such as for maintaining a coherent domain. For example, the wrapper circuitry 306 can implement state circuitry 352 to save state information associated with the circuitry that did not detect the error (e.g., the non-errored circuitry, such as the second circuitry 304). The synchronization event may synchronize the first circuitry 302 to the second circuitry 304 using the state information associated with the second circuitry 304 to reestablish lockstep and resume operation or execution using both circuitry (e.g., error detected causing the first indication 334 to be sent→select the second output 314 in a dynamic master/checker changeover→save state information associated with the second circuitry 304→resynchronize→restore state information to reestablish lockstep→continue operation or execution using both circuitry). In some implementations, the synchronization event may synchronize the first circuitry 302 to the second circuitry 304, corresponding to a time before detection of the error.

In some cases, the error detection circuitry 342, implemented by the second circuitry 304 (e.g., the checker), can detect an error. The second circuitry 304 can send the second indication 344 to the wrapper circuitry 306 (e.g., the monitor circuitry 350) based on the detection. The wrapper circuitry 306 can, responsive to receipt of the second indication 344, ignore comparing the first output 312 and the second output 314 to check for correctness. For example, the wrapper circuitry 306 can disable the checker circuitry 320, or otherwise block the difference detection 322, based on receiving the second indication 344. Further, the wrapper circuitry 306 (e.g., the monitor circuitry 350) can control the selection circuitry 316 to continue the selection of the first output 312. As a result, the wrapper circuitry 306 can select the first output 312 and ignore the check to maintain availability.

In some implementations, the wrapper circuitry 306 can select the first output 312 and ignore the check until a synchronization event occurs between the first circuitry 302 and the second circuitry 304. The synchronization event may synchronize the second circuitry 304 to the first circuitry 302, such as for restarting lockstep operation between the first circuitry 302 and the second circuitry 304. The synchronization event may occur after selecting the first output 312 and ignoring the check for correctness. The synchronization event may synchronize the second circuitry 304 to the first circuitry 302 based on state information associated with the first circuitry 302. The state information may include the states of one or more functional blocks implemented by the second circuitry 304, such as for maintaining a coherent domain. For example, the state circuitry 352 can save state information associated with the circuitry that did not detect the error (e.g., the non-errored circuitry, such as the first circuitry 302). The synchronization event may synchronize the second circuitry 304 to the first circuitry 302 using the state information associated with the first circuitry 302 to reestablish lockstep and resume operation or execution using both circuitry (e.g., error detected causing the second indication 344 to be sent→select the first output 312 and ignore the check→save state information associated with the first circuitry 302→resynchronize→restore state information to reestablish lockstep→continue operation or execution using both circuitry). In some implementations, the synchronization event may synchronize the second circuitry 304 to the first circuitry 302, corresponding to a time before detection of the error.

Thus, the wrapper circuitry 306 may provide a path for the first circuitry 302 or the second circuitry 304 to provide an indication (e.g., a hint, such as the first indication 334 and/or the second indication 344) that the first circuitry 302 or the second circuitry 304 will initiate a difference at a later time (e.g., the first output 312 and the second output 314 will be different, zero to N clock cycles after the indication, where N is an integer greater than 1). The indication may be based on a detected error within the circuitry (e.g., within the first circuitry 302 or the second circuitry 304). The indication may be used to telegraph which circuitry detected the error and will soon cause the difference (e.g., the first circuitry 302 or the second circuitry 304). The wrapper circuitry 306 may use the indication to decrease the severity of a difference, and in some cases, may switch outputs from the first circuitry 302 (e.g., the master) to the second circuitry 304 (e.g., the checker), such as when the first circuitry 302 is the one that detected the error and indicated a future difference. The circuitry without the error could then be used to provide responses to logic outside of the wrapper circuitry 306, such as to avoid a deadlock (e.g., a condition in which the second system 310 ignores the system output 318, thereby isolating the first circuitry 302 and the second circuitry 304, resulting in a loss of work from the first circuitry 302 and the second circuitry 304) and increase availability. The same circuitry could also be used to provide a snapshot of correctly operating circuitry (e.g., the state information) for use in restarting lockstep with a state save and restore.

As a result, availability may be improved. For example, a deadlock, resulting from transaction suppression due to a difference between the first output and the second output (e.g., indicated by the difference detection 322), may be avoided, such as by continuing to use the circuitry without the error, at least for a limited time until a synchronization event can occur.

In some implementations, the wrapper circuitry 306 can implement injection circuitry 354 to inject a signal to cause the error. For example, injecting a signal to cause the error may enable testing the error detection circuitry (e.g., the error detection circuitry 332 and/or the error detection circuitry 342) to verify detection of the error, and/or testing the checker circuitry 320 to verify generation of the difference detection 322 (e.g., when the error causes a difference between the first output 312 and the second output 314). For example, the injection circuitry 354 may be configured to inject a difference in inputs the wrapper sends to both functional units that causes one to produce different outputs, either in value or in time, versus the other functional unit. With additional reference to FIG. 4, a system 400 may include a delay element D1 in the input path to the first circuitry 302 (e.g., a branch of the input 308, connecting to the first circuitry 302), and a delay element D2 in the output path from the second circuitry 304 (e.g., in a path of the second output 314). The delay element D1 may delay the input 308 to the first circuitry 302 so that the input 308 is received by the first circuitry 302 later than the input 308 is received by the second circuitry 304 (e.g., N clock cycles later, where N is an integer greater than 1). In this configuration, the second circuitry 304 may be a leader (e.g., executing some amount of time before the first circuitry 302), and the first circuitry 302 may be a follower (e.g., executing some amount of time after the second circuitry 304). The delay element D2 may delay the second output 314 (e.g., delay by the N clock cycles) so that the first output 312 and the second output 314 are synchronized when the checker circuitry 320 compares the first output 312 to the second output 314 to detect a difference. The wrapper circuitry 306, via the injection circuitry 354, can inject a signal in the delay element D1 to cause an error in the first circuitry 302. For example, injecting the signal in the delay element D1 may enable testing the error detection circuitry 332, such as by determining whether the monitor circuitry 350 receives the first indication 334 based on the injection. The signal could be injected by writing to a register that identifies a value to inject based on a trigger.

In some implementations, the system 400 may include a delay element D3 (shown in dashed lines) in the input path to the second circuitry 304 (e.g., a branch of the input 308, connecting to the second circuitry 304), and a delay element D4 (shown in dashed lines) in the output path from the first circuitry 302 (e.g., in a path of the first output 312). The delay element D3 may delay the input 308 to the second circuitry 304 so that the input 308 is received by the second circuitry 304 later than the input 308 is received by the first circuitry 302 (e.g., N clock cycles later, where N is an integer greater than 1). In this configuration, the first circuitry 302 may be the leader (e.g., executing some amount of time before the second circuitry 304), and the second circuitry 304 may be the follower (e.g., executing some amount of time after the first circuitry 302). The delay element D4 may delay the first output 312 (e.g., delay by the N clock cycles) so that the first output 312 and the second output 314 are synchronized when the checker circuitry 320 compares the first output 312 to the second output 314 to detect a difference. The wrapper circuitry 306, via the injection circuitry 354, can inject a signal in the delay element D3 to cause an error in the second circuitry 304. For example, injecting the signal in the delay element D3 may enable testing the error detection circuitry 342, such as by determining whether the monitor circuitry 350 receives the second indication 344 based on the injection. The signal could be injected by writing to a register that identifies a value to inject based on a trigger.

In some implementations, the system may operate in a lockstep mode or a performance mode. For example, referring again to FIG. 3, in the lockstep mode, the first circuitry 302 and the second circuitry 304 may receive a same input (e.g., the input 308) and may generate one set of results (e.g., the system output 318) that is checked for correctness. However, in a performance mode, the first circuitry 302 and the second circuitry 304 may receive different system inputs and may generate two sets of results in different system outputs (not shown).

In some implementations, the wrapper circuitry 306 may select one or more interfaces of the circuitry to include for comparison by the checker circuitry 320, and/or may select one or more interfaces of the circuitry to exclude from comparison by the checker circuitry 320. For example, the wrapper circuitry 306 may select a first interface of the first circuitry 302 (e.g., a first set of one or more signals included in the first output 312) to include for comparison with a first interface of the second circuitry 304 (e.g., a first set of one or more signals included in the second output 314). The wrapper circuitry 306 may also select a second interface of the first circuitry 302 (e.g., a second set of one or more signals included in the first output 312) to exclude from the comparison by the checker circuitry 320 (e.g., exclude from comparing with a second interface of the second circuitry 304, such as a second set of one or more signals included in the second output 314). In some implementations, the wrapper circuitry 306 may select one or more of the interfaces that may be associated with indications used by the monitor circuitry 350. For example, the wrapper circuitry 306 may limit the dynamic master/checker changeover to indications (e.g., the first indication 334 or the second indication 344) that indicate that a difference will result in the one or more interfaces that are selected (e.g., the first set of one or more signals included in the first output 312).

In some implementations, the wrapper circuitry 306 can compare the first output 312 and the second output 314 to check correctness by default, and responsive to receipt of the indication, select the second output as a system output, and continue checking for correctness by comparing the first output 312 and the second output 314. This may enable a dynamic master/checker changeover (e.g., the first circuitry 312, initially the master, becomes the checker, and the second circuitry 314, initially the checker, becomes the master), while the error does not result in a difference detection 322 that is detected by the checker circuitry 320 (e.g., when the error does not cause a difference between the first output 312 and the second output 314, or while the error has not yet caused a difference between the first output 312 and the second output 314).

FIG. 5 is a flow chart of an example of a technique 500 for selecting an output as a system output responsive to an indication of an error. The technique 500 can be executed using computing devices, such as the systems, hardware, and software described with respect to FIGS. 1-4. For simplicity of explanation, the technique 500 is depicted and described herein as a series of steps or operations. However, the steps or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

At 502, a first circuitry can generate a first output based on an input. For example, the first circuitry 302 can generate the first output 312 based on the input 308. The input could be a system input, transmitted to a wrapper circuitry (e.g., the wrapper circuitry 306), from another system in a computing environment (e.g., logic outside of the wrapper circuitry). The first output may include one or more signals that are generated by the first circuitry in response to the input. The first circuitry could be a first processor core, a first SoC, or a first functional unit, such as an integer unit, vector unit, ALU, or encryption unit. The first circuitry can operate synchronously with a second circuitry, in lockstep, to generate the first output. The first circuitry could be a master in the lockstep operation (e.g., the first output may be initially selected as system output).

At 504, the second circuitry can generate a second output based on an input. For example, the second circuitry 304 can generate the second output 314 based on the input 308. The input may be the same input as the input to the first circuitry. The second output may include one or more signals that are generated by the second circuitry in response to the input. The second circuitry could be a second processor core, a second SoC, or a second functional unit, such as an integer unit, vector unit, ALU, or encryption unit. The second circuitry can operate synchronously with the first circuitry, in lockstep, to generate the second output. The second circuitry could be a checker in the lockstep operation (e.g., the second output may be initially used to check the first output for correctness).

At 506, the first circuitry can send an indication responsive to detection of an error, including when the first output is generated. For example, error detection circuitry (e.g., the error detection circuitry 332) implemented by the microarchitecture of the first circuitry can be used to detect the error in the first circuitry. The error may be detected, for example, using ECC, a parity bit, a checksum, or a CRC, implemented by the first circuitry. The first circuitry can send the indication (e.g., the first indication 334) responsive to detection of the error, including when the first output is generated. For example, the indication could include one or more signals that are generated by the first circuitry, which may not be included in first output. The first circuitry can send the indication to the wrapper circuitry before the error causes the first output and the second output to be different. In some implementations, types of errors may be classified by the error detection circuitry so that a first type of error can cause the error detection circuitry to send the indication while a second type of error would not cause the error detection circuitry to send the indication.

At 508, the wrapper circuitry can compare the first output and the second output to check correctness by default, and responsive to receipt of the indication, can select the second output as a system output without checking for correctness by comparing the first output and the second output (e.g., a recovery response that includes a dynamic master/checker changeover). For example, the wrapper circuitry can implement monitor circuitry (e.g., the monitor circuitry 350) to receive the indication. The monitor circuitry can control a selection made by a selection circuitry (e.g., the selection circuitry 316). The monitor circuitry can control the selection circuitry to select the second output based on receiving the indication (e.g., the second circuitry can become the master). Further, the wrapper circuitry can ignore comparing the first output and the second output to check for correctness based on receiving the indication. For example, the wrapper circuitry can disable the checker circuitry, or otherwise block a difference detection, based on receiving the indication.

Figure 6:
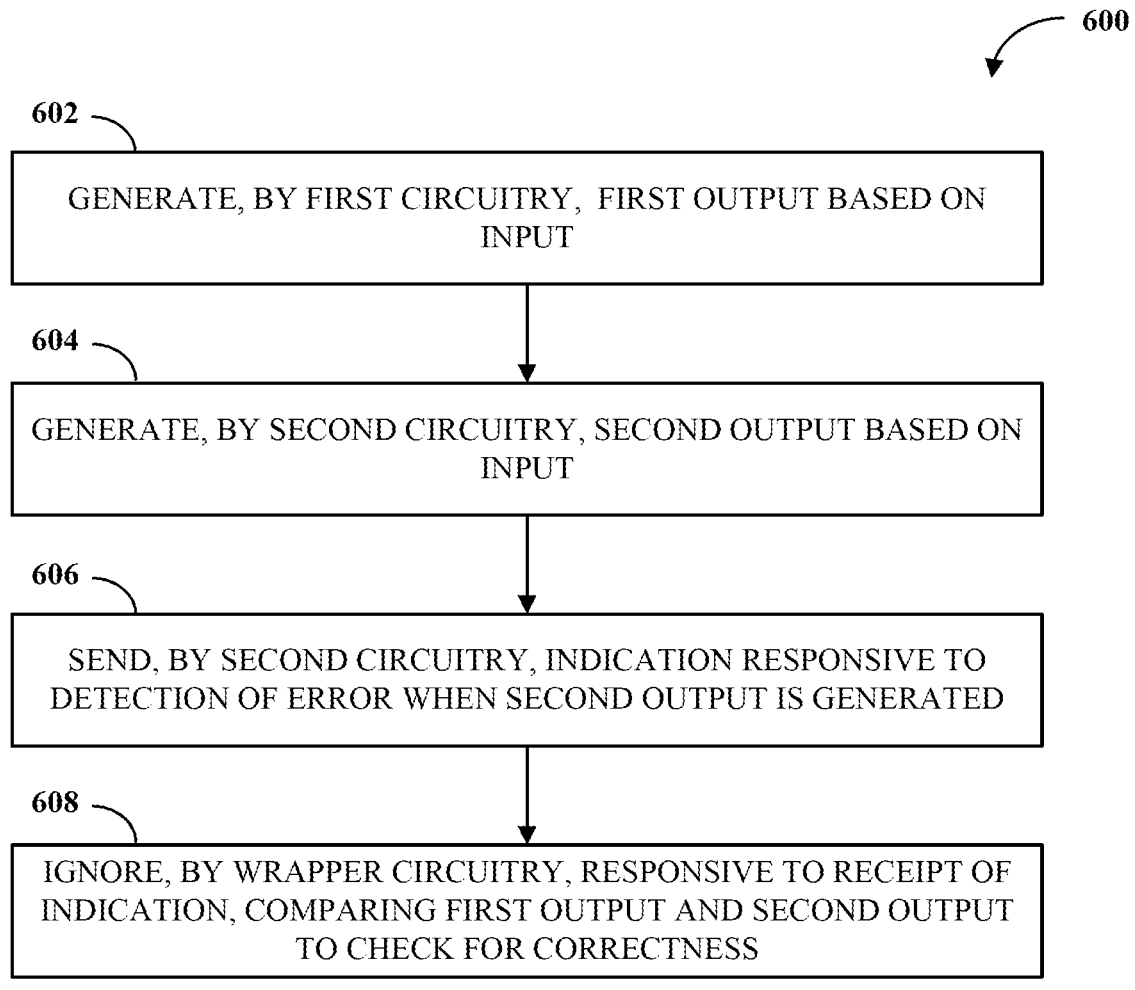
FIG. 6 is a flow chart of an example of a technique for ignoring a check for correctness responsive to an indication of an error.

FIG. 6 is a flow chart of an example of a technique for ignoring a check for correctness responsive to an indication of an error. The technique 600 can be executed using computing devices, such as the systems, hardware, and software described with respect to FIGS. 1-4. For simplicity of explanation, the technique 600 is depicted and described herein as a series of steps or operations. However, the steps or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

At 602, a first circuitry can generate a first output based on an input. For example, the first circuitry 302 can generate the first output 312 based on the input 308. The input could be a system input, transmitted to a wrapper circuitry (e.g., the wrapper circuitry 306), from another system in a computing environment (e.g., logic outside of the wrapper circuitry). The first output may include one or more signals that are generated by the first circuitry in response to the input. The first circuitry could be a first processor core, a first SoC, or a first functional unit, such as an integer unit, vector unit, ALU, or encryption unit. The first circuitry can operate synchronously with a second circuitry, in lockstep, to generate the first output. The first circuitry could be a master in the lockstep operation (e.g., the first output may be initially selected as system output).

At 604, the second circuitry can generate a second output based on an input. For example, the second circuitry 304 can generate the second output 314 based on the input 308. The input may be the same input as the input to the first circuitry. The second output may include one or more signals that are generated by the second circuitry in response to the input. The second circuitry could be a second processor core, a second SoC, or a second functional unit, such as an integer unit, vector unit, ALU, or encryption unit. The second circuitry can operate synchronously with the first circuitry, in lockstep, to generate the second output. The second circuitry could be a checker in the lockstep operation (e.g., the second output may be initially used to check the first output for correctness).

At 606, the second circuitry can send an indication responsive to detection of an error, including while the second output is generated. For example, error detection circuitry (e.g., the error detection circuitry 342) implemented by the microarchitecture of the second circuitry can be used to detect the error in the second circuitry. The error may be detected, for example, using ECC, a parity bit, a checksum, or a CRC, implemented by the second circuitry. The second circuitry can send the indication (e.g., the second indication 344) responsive to detection of the error, including while the second output is generated. For example, the indication could include one or more signals that are generated by the second circuitry, which may not be included in the second output. The second circuitry can send the indication to the wrapper circuitry before the error causes the first output and the second output to be different. In some implementations, types of errors may be classified by the error detection circuitry so that a first type of error can cause the error detection circuitry to send the indication while a second type of error would not cause the error detection circuitry to send the indication.

At 608, the wrapper circuitry, responsive to receipt of the indication, can ignore comparing the first output and the second output to check for correctness. For example, the wrapper circuitry can disable checker circuitry (e.g., the checker circuitry 320), or otherwise block a difference detection (e.g., the difference detection 322), based on receiving the indication. Further, the wrapper circuitry can control selection circuitry (e.g., the selection circuitry 316) to continue the selection of the first output 312.

Figure 7:
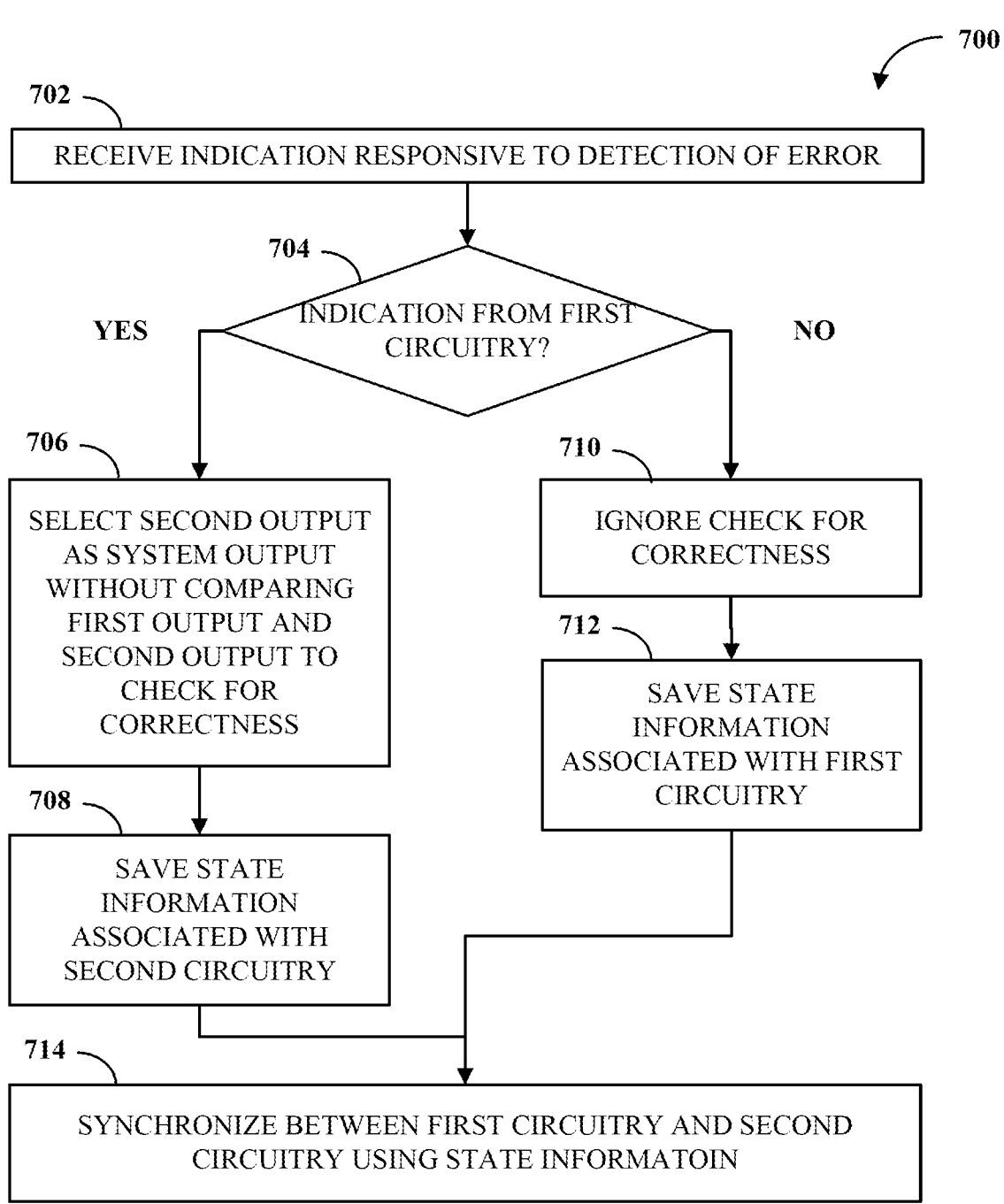
FIG. 7 is a flow chart of an example of a technique for synchronizing circuitry responsive to an indication of an error.

FIG. 7 is a flow chart of an example of a technique for synchronizing circuitry responsive to an indication of an error. The technique 700 can be executed using computing devices, such as the systems, hardware, and software described with respect to FIGS. 1-4. For simplicity of explanation, the technique 700 is depicted and described herein as a series of steps or operations. However, the steps or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

At 702, a wrapper circuitry (e.g., the wrapper circuitry 306) can receive an indication responsive to detection of an error. The indication could be from a first circuitry (e.g., the first circuitry 302) that generates a first output (e.g., the first output 312) based on an input (e.g., the input 308) or from a second circuitry (e.g., the second circuitry 304) that generates a second output (e.g., the second output 314) based on the input (e.g., the input 308). For example, the wrapper circuitry can implement monitor circuitry (e.g., the monitor circuitry 350) to receive the indication. The indication may be responsive to a detection of an error from the first circuitry or the second circuitry. The wrapper circuitry can initially select the first output to be a system output (e.g., the system output 318), so that the first circuitry 302 is operating as a master when the first circuitry 302 and the second circuitry 304 are operating in lockstep.

At 704, the wrapper circuitry can determine whether the indication is from the first circuitry (e.g., the master). If the indication is from the first circuitry ("Yes"), at 706 the wrapper circuitry may compare the first output and the second output to check correctness by default, and responsive to receipt of the indication, select the second output as a system output without checking for correctness by comparing the first output and the second output (e.g., the wrapper circuitry may perform step 508 in FIG. 5). At 708, the wrapper circuitry may save state information associated with the second circuitry. For example, the wrapper circuitry can implement state circuitry (e.g., the state circuitry 352) to save state information associated with the circuitry that did not detect the error (e.g., the non-errored circuitry, such as the second circuitry). At 714, the wrapper circuitry can then synchronize between the first circuitry and the second circuitry using the state information. For example, the wrapper circuitry can synchronize the first circuitry to the second circuitry, using the state information, to reestablish lockstep and resume operation or execution.

However, at 704, if the indication is not from the first circuitry ("No"), at 710 the wrapper circuitry may compare the first output and the second output to check correctness by default, and responsive to receipt of the indication, ignore comparing the first output and the second output to check for correctness (e.g., the wrapper circuitry may perform step 608 in FIG. 6). At 712, the wrapper circuitry may save state information associated with the first circuitry. For example, the state circuitry can save state information associated with the circuitry that did not detect the error (e.g., the non-errored circuitry, such as the first circuitry). At 714, the wrapper circuitry can then synchronize between the first circuitry and the second circuitry using the state information. For example, the wrapper circuitry can synchronize the second circuitry to the first circuitry, using the state information, to reestablish lockstep and resume operation or execution.

FIG. 8 is a flow chart of an example of a technique for injecting a signal in a delay element to cause an error. For example, injecting the signal in the delay element may enable testing error detection circuitry. The technique 800 can be executed using computing devices, such as the systems, hardware, and software described with respect to FIGS. 1-4. For simplicity of explanation, the technique 800 is depicted and described herein as a series of steps or operations. However, the steps or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

At 802, a delay element can delay input to a first circuitry so that the input is received by the first circuitry later than the input is received by the second circuitry. For example, the delay element D1, in the input path to the first circuitry 302, may delay the input 308 to the first circuitry 302 so that the input 308 is received by the first circuitry 302 later than the input 308 is received by the second circuitry 304. In this configuration, the second circuitry may be a leader (e.g., executing some amount of time before the first circuitry), and the first circuitry may be a follower (e.g., executing some amount of time after the second circuitry).

At 804, a delay element can delay a second output from the second circuitry so that a first output from the first circuitry and the second output are synchronized. For example, the delay element D2 may delay the second output 314 so that the first output 312 and the second output 314 are synchronized when checker circuitry implemented by wrapper circuitry (e.g., the checker circuitry 320, implemented by the wrapper circuitry 306) compares the first output 312 to the second output 314 to detect a difference.

At 806, an injection circuit can inject a signal in the delay element that delays the input to the first circuitry to cause an error in the first circuitry. For example, the wrapper circuitry 306, via injection circuitry (e.g., the injection circuitry 354), can inject a signal in the delay element D1 to cause an error in the first circuitry 302. For example, injecting the signal in the delay element D1 may enable testing error detection circuitry in the first circuitry, such as by determining whether monitor circuitry implemented by the wrapper circuitry (e.g., the monitor circuitry 350) receives an indication (e.g., the first indication 334) based on the injection. The signal could be injected by writing to a register that identifies a value to inject based on a trigger. In some implementations, the injection circuit can inject a signal in a delay element that delays the input to the second circuitry (e.g., the delay element D3) to cause an error in the second circuitry. For example, injecting the signal in the delay element D3 may enable testing error detection circuitry in the second circuitry, such as by determining whether the monitor circuitry receives an indication (e.g., the second indication 344) based on the injection.

Figure 9:
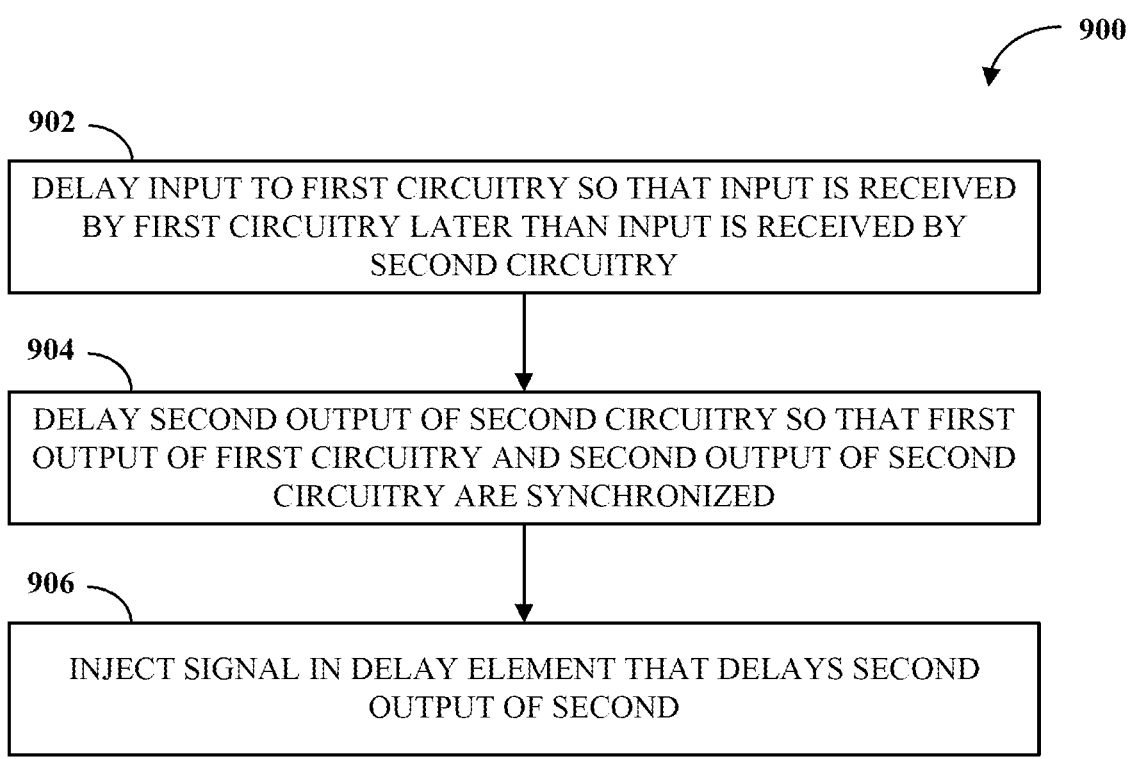
FIG. 9 is a flow chart of another example of a technique for injecting a signal in a delay element.

FIG. 9 is a flow chart of another example of technique for injecting a signal in a delay element. The technique 900 can be executed using computing devices, such as the systems, hardware, and software described with respect to FIGS. 1-4. For simplicity of explanation, the technique 900 is depicted and described herein as a series of steps or operations. However, the steps or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

At 902, a delay element can delay input to a first circuitry so that the input is received by the first circuitry later than the input is received by the second circuitry. For example, the delay element D1, in the input path to the first circuitry 302, may delay the input 308 to the first circuitry 302 so that the input 308 is received by the first circuitry 302 later than the input 308 is received by the second circuitry 304. In this configuration, the second circuitry may be a leader (e.g., executing some amount of time before the first circuitry), and the first circuitry may be a follower (e.g., executing some amount of time after the second circuitry).

At 904, a delay element can delay a second output from the second circuitry so that a first output from the first circuitry and the second output are synchronized. For example, the delay element D2 may delay the second output 314 so that the first output 312 and the second output 314 are synchronized when checker circuitry implemented by wrapper circuitry (e.g., the checker circuitry 320, implemented by the wrapper circuitry 306) compares the first output 312 to the second output 314 to detect a difference.

At 906, an injection circuit can inject a signal in the delay element that delays the second output from the second circuitry. For example, the wrapper circuitry 306, via injection circuitry (e.g., the injection circuitry 354), can inject a signal in the delay element D2. The signal could be injected by writing to a register that identifies a value to inject based on a trigger. In some implementations, the injection circuit can inject a signal in a delay element that delays the first output from the first circuitry.

Some implementations may include an apparatus including: a first circuitry configured to: generate a first output based on an input, and send an indication responsive to detection of an error while the first output is generated; a second circuitry configured to generate a second output based on the input; and a wrapper circuitry configured to compare the first output and the second output to check correctness by default, and responsive to receipt of the indication, select the second output as a system output without checking for correctness by comparing the first output and the second output. In some implementations, the second circuitry is configured to send a second indication responsive to detection of a second error while the second output is generated, and wherein the wrapper circuitry is configured to, responsive to receipt of the second indication, ignore the check for correctness. In some implementations, the wrapper circuitry provides the system output from the second circuitry to avoid a deadlock resulting from transaction suppression due to a difference between the first output and the second output. In some implementations, the first circuitry is a first processor core, and the second circuitry is a second processor core. In some implementations, the first circuitry is a first functional unit implemented by a processor core, and the second circuitry is a second functional unit implemented by the processor core. In some implementations, the first circuitry is a first SoC, and the second circuitry is a second SoC. In some implementations, the error is detected using at least one of an ECC, a parity bit, a checksum, or a CRC. In some implementations, the wrapper circuitry saves state information associated with the second circuitry when the first circuitry sends the indication, the state information enabling a synchronization between the first circuitry and the second circuitry. In some implementations, the apparatus may further include an injection circuitry connected to the first circuitry, wherein the injection circuitry is configured to inject a signal to cause the error. In some implementations, the apparatus may further include a first delay element to delay the input to the first circuitry so that the input is received by the first circuitry later than the input is received by the second circuitry, and a second delay element to delay the second output so that the first output and the second output are synchronized, wherein the wrapper circuitry is configured to inject a signal in the first delay element to cause the error. In some implementations, the check for correctness is performed by comparing the first output to the second output to detect a difference between the first output and the second output. In some implementations, the first circuitry and the second circuitry are configured to operate in lockstep with the first circuitry initially operating as a master and the second circuitry initially operating as a checker. In some implementations, the wrapper circuitry is configured to initially select the first output as the system output and use the second output to check for correctness of the first output. In some implementations, the first circuitry includes a processor core with multiple pipeline stages and the error is detected in an earlier pipeline stage before a later pipeline stage that writes data to generate the first output.

Some implementations may include a method including: generating, by a first circuitry, a first output based on an input, and sending, by the first circuitry, an indication responsive to detection of an error when the first output is generated; generating, by a second circuitry, a second output based on the input; and comparing the first output and the second output to check correctness by default, and responsive to receipt of the indication, selecting the second output as a system output without checking for correctness by comparing the first output and the second output. In some implementations, the method may include sending, by the second circuitry, a second indication responsive to detection of a second error while the second output is generated; and ignoring, by the wrapper circuitry, responsive to receipt of the second indication, the check for correctness until a synchronization event between the first circuitry and the second circuitry. In some implementations, the wrapper circuitry provides the system output from the second circuitry to avoid a deadlock resulting from transaction suppression due to a difference between the first output and the second output. In some implementations, the error is detected using at least one of an ECC, a parity bit, a checksum, or a CRC. In some implementations, the method may include saving, by the wrapper circuitry, state information associated with the second circuitry when the first circuitry sends the indication; and synchronizing between the first circuitry and the second circuitry using the state information. In some implementations, the method may include injecting a signal on a wire connected to the first circuitry to cause the error. In some implementations, the method may include delaying the input to the first circuitry so that the input is received by the first circuitry later than the input is received by the second circuitry; delaying the second output so that the first output and the second output are synchronized; and injecting a signal in a delay element, used to delay the input to the first circuitry, to cause the error. In some implementations, the method may include performing the check for correctness by comparing the first output to the second output to detect a difference between the first output and the second output. In some implementations, the method may include operating the first circuitry and the second circuitry in lockstep with the first circuitry initially operating as a master and the second circuitry initially operating as a checker. In some implementations, the method may include initially selecting the first output as the system output and using the second output to check for correctness of the first output. In some implementations, the first circuitry includes a processor core with multiple pipeline stages and the error is detected in an earlier pipeline stage before a later pipeline stage that writes data to generate the first output.

Some implementations may include a non-transitory computer readable medium comprising a circuit representation that, when processed by a computer, is used to program or manufacture an integrated circuit including: a first circuitry configured to: generate a first output based on an input, and send an indication responsive to detection of an error when the first output is generated; a second circuitry configured to generate a second output based on the input; and a wrapper circuitry configured to compare the first output and the second output to check correctness by default, and responsive to receipt of the indication, select the second output as a system output without checking for correctness by comparing the first output and the second output. In some implementations, the second circuitry is configured to send a second indication responsive to detection of a second error while the second output is generated, and wherein the wrapper circuitry is configured to, responsive to receipt of the second indication, ignore the check for correctness. In some implementations, the wrapper circuitry provides the system output from the second circuitry to avoid a deadlock resulting from transaction suppression due to a difference between the first output and the second output. In some implementations, the error is detected using at least one of an ECC, a parity bit, a checksum, or a CRC. In some implementations, the wrapper circuitry saves state information associated with the second circuitry when the first circuitry sends the indication, the state information enabling a synchronization between the first circuitry and the second circuitry. In some implementations, the circuit representation, when processed by the computer, is used to program or manufacture the integrated including: an injection circuitry connected to the first circuitry, wherein the injection circuitry is configured to inject a signal to cause the error. In some implementations, the circuit representation, when processed by the computer, is used to program or manufacture the integrated including: a first delay element to delay the input to the first circuitry so that the input is received by the first circuitry later than the input is received by the second circuitry, and a second delay element to delay the second output so that the first output and the second output are synchronized, wherein the wrapper circuitry is configured to inject a signal in the first delay element to cause the error. In some implementations, the check for correctness is performed by comparing the first output to the second output to detect a difference between the first output and the second output. In some implementations, the first circuitry and the second circuitry are configured to operate in lockstep with the first circuitry initially operating as a master and the second circuitry initially operating as a checker. In some implementations, the wrapper circuitry is configured to initially select the first output as the system output and use the second output to check for correctness of the first output. In some implementations, the first circuitry includes a processor core with multiple pipeline stages and the error is detected in an earlier pipeline stage before a later pipeline stage that writes data to generate the first output.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. An apparatus comprising:
a first circuitry configured to:
    generate a first output based on an input, and
    generate a signal, separate from the first output, indicating a detection of an error associated with the first output;
a second circuitry configured to generate a second output based on the input; and
a wrapper circuitry configured to:
    receive the first output and the second output;
    after receiving the first output and the second output, receive the signal indicating the detection of the error associated with the first output;
    between (i) receiving the first output and the second output and (ii) receiving the signal indicating the detection of the error associated with the first output, compare the first output and the second output to perform a check for correctness; and
    responsive to receipt of the signal indicating the detection of the error associated with the first output, select the second output from the second circuitry as a system output and disable the check for correctness.

2. The apparatus of claim 1, wherein the second circuitry is configured to generate a second signal, separate from the second output, indicating a detection of a second error associated with the second output, and wherein the wrapper circuitry is configured to, responsive to receipt of the second signal, ignore the check for correctness.

3. The apparatus of claim 1, wherein the wrapper circuitry provides the system output from the second circuitry to avoid a deadlock resulting from transaction suppression due to a difference between the first output and the second output.

4. The apparatus of claim 1, wherein the first circuitry is a first processor core, and the second circuitry is a second processor core.

5. The apparatus of claim 1, wherein the first circuitry is a first functional unit implemented by a processor core, and the second circuitry is a second functional unit implemented by the processor core.

6. The apparatus of claim 1, wherein the first circuitry is a first system on a chip (SoC), and the second circuitry is a second SoC.

7. The apparatus of claim 1, wherein the error associated with the first output is detected using at least one of an error correction code (ECC), a parity bit, a checksum, or a cyclic redundancy check (CRC).

8. The apparatus of claim 1, wherein the wrapper circuitry saves state information associated with the second circuitry when the first circuitry sends the signal indicating the detection of the error associated with the first output, the state information enabling a synchronization between the first circuitry and the second circuitry.

9. The apparatus of claim 1, further comprising:
an injection circuitry connected to the first circuitry, wherein the injection circuitry is configured to inject a signal to cause the error associated with the first output.

10. The apparatus of claim 1, further comprising:
a first delay element to delay the input to the first circuitry so that the input is received by the first circuitry later than the input is received by the second circuitry, and a second delay element to delay the second output so that the first output and the second output are synchronized, wherein the wrapper circuitry is configured to inject a signal in the first delay element to cause the error associated with the first output.

11. The apparatus of claim 1, wherein the check for correctness is performed by comparing the first output to the second output to detect a difference between the first output and the second output.

12. The apparatus of claim 1, wherein the first circuitry and the second circuitry are configured to operate in lockstep with the first circuitry initially operating as a master and the second circuitry initially operating as a checker.

13. The apparatus of claim 1, wherein the wrapper circuitry is configured to initially select the first output as the system output and use the second output to check for correctness of the first output.

14. The apparatus of claim 1, wherein the first circuitry includes a processor core with multiple pipeline stages and the error associated with the first output is detected in an earlier pipeline stage before a later pipeline stage that writes data to generate the first output.

15. A method comprising:
generating, by a first circuitry, a first output based on an input;
generating, by the first circuitry, a signal, separate from the first output, indicating a detection of an error associated with the first output;
sending, by the first circuitry, the signal indicating the detection of the error associated with the first output;
generating, by a second circuitry, a second output based on the input;
prior to receipt of the signal indicating the detection of the error associated with the first output, comparing the first output and the second output to perform a check for correctness; and
responsive to receipt of the signal indicating the detection of the error associated with the first output, selecting the second output from the second circuitry as a system output and disabling the check for correctness.

16. The method of claim 15, further comprising:
generating, by the second circuitry, a second signal, separate from the second output, indicating a detection of a second error associated with the second output; and
ignoring, responsive to receipt of the second signal, the check for correctness until a synchronization event between the first circuitry and the second circuitry.

17. The method of claim 15, further comprising:
saving, state information associated with the second circuitry when the first circuitry sends the signal indicating the detection of the error associated with the first output; and
synchronizing between the first circuitry and the second circuitry using the state information.

18. The method of claim 15, further comprising:
delaying the input to the first circuitry so that the input is received by the first circuitry later than the input is received by the second circuitry;
delaying the second output so that the first output and the second output are synchronized; and injecting a signal in a delay element, used to delay the input to the first circuitry, to cause the error.

19. The method of claim 15, further comprising:

operating the first circuitry and the second circuitry in lockstep with the first circuitry initially operating as a master and the second circuitry initially operating as a checker.

20. A non-transitory computer readable medium comprising a circuit representation that, when processed by a computer, is used to program or manufacture an integrated circuit comprising:

a first circuitry configured to:

generate a first output based on an input, and generate a signal, separate from the first output, indicating a detection of an error associated with the first output;

a second circuitry configured to generate a second output based on the input; and a wrapper circuitry configured to:

receive the first output and the second output;

after receiving the first output and the second output, receive the signal indicating the detection of the error associated with the first output;

between (i) receiving the first output and the second output and (ii) receiving the signal indicating the detection of the error associated with the first output, compare the first output and the second output to perform a check for correctness; and responsive to receipt of the signal indicating the detection of the error associated with the first output, select the second output from the second circuitry as a system output and disable the check for correctness.

\* \* \* \* \*